(12) United States Patent
Jabeur et al.

(10) Patent No.: US 10,741,232 B1
(45) Date of Patent: Aug. 11, 2020

(54) TUNABLE REFERENCE SYSTEM WITH SENSE AMPLIFIER OFFSET CANCELLATION FOR MAGNETIC RANDOM ACCESS MEMORY

(71) Applicant: International Business Machines Corporation, Armonk, NY (US)

(72) Inventors: Kotb Jabeur, Essex Junction, VT (US); John Kenneth DeBrosse, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/452,124

(22) Filed: Jun. 25, 2019

(51) Int. Cl.
G11C 11/00 (2006.01)
G11C 11/16 (2006.01)

(52) U.S. Cl.
CPC ...... *G11C 11/1673* (2013.01); *G11C 11/1659* (2013.01); *G11C 11/1675* (2013.01)

(58) Field of Classification Search
CPC ............ G11C 11/1673; G11C 11/1659; G11C 11/1675
USPC ........................................................ 365/158
See application file for complete search history.

(56) References Cited

U.S. PATENT DOCUMENTS

| | | | |
|---|---|---|---|
| 6,445,612 B1 | 9/2002 | Naji | |
| 8,116,122 B2 | 2/2012 | Li et al. | |
| 8,693,273 B2 | 4/2014 | Yuh et al. | |
| 8,902,641 B2 | 12/2014 | Chih et al. | |
| 9,153,307 B2 | 10/2015 | Kim et al. | |
| 9,336,873 B2 | 5/2016 | August et al. | |
| 9,406,366 B2 | 8/2016 | Aoki | |
| 9,455,013 B2 | 9/2016 | Kim et al. | |
| 2012/0051122 A1* | 3/2012 | Tsuji | H01L 27/228 365/158 |
| 2012/0069629 A1* | 3/2012 | Ueda | G11C 11/1659 365/148 |
| 2017/0365357 A1 | 12/2017 | Kobayashi et al. | |

OTHER PUBLICATIONS

Zhang L, Zhao W, Zhuang Y, Bao J, Tang H, Li C, Xiang X. Design and analysis of the reference cells for STT-MRAM. IEICE Electronics Express. Jun. 25, 2013;10(12):20130352-. (6 Pages Total).

* cited by examiner

*Primary Examiner* — Huan Hoang
(74) *Attorney, Agent, or Firm* — Daniel Morris; Otterstedt, Wallace & Kammer, LLP

(57) ABSTRACT

A memory device comprising a memory array of a plurality of memory bit cells; a read reference system comprising four or more reference memory bit cells in a reference column of the memory array; wherein a first bit cell of the reference memory bit cells is always selected; wherein a bitline of the first bit cell of the reference memory bit cells is connected to a bitline of a first subset of the reference memory bit cells, and a select line of the first bit cell of the reference memory bit cells is connected to a reference select signal; wherein a select line of each of the first subset of the reference memory bit cells and a second subset of the reference memory bit cells are coupled together; and wherein a bitline $bl_{ref}$ of the second subset of the reference memory bit cells outputs a read reference signal.

12 Claims, 8 Drawing Sheets

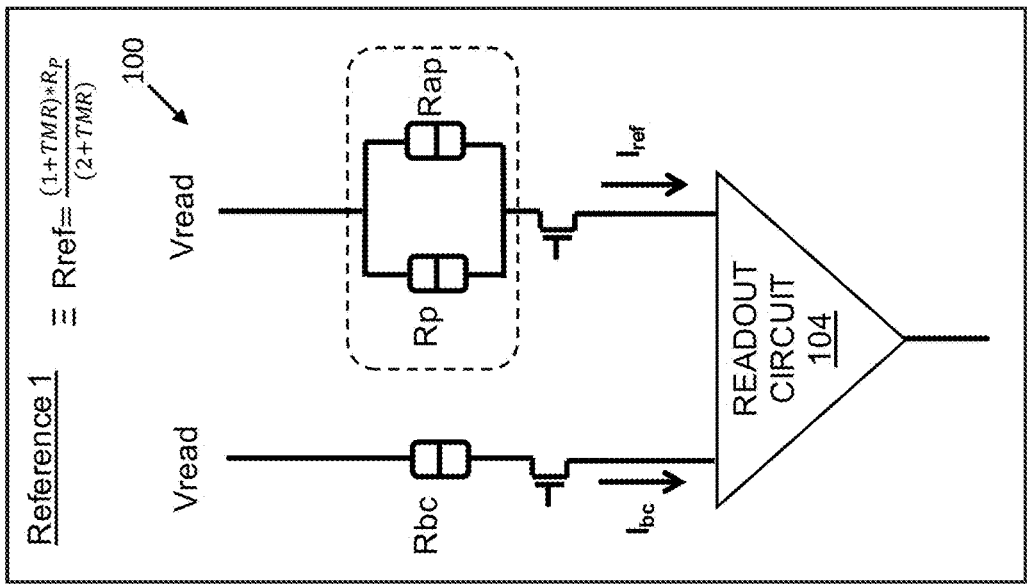
FIG. 1A
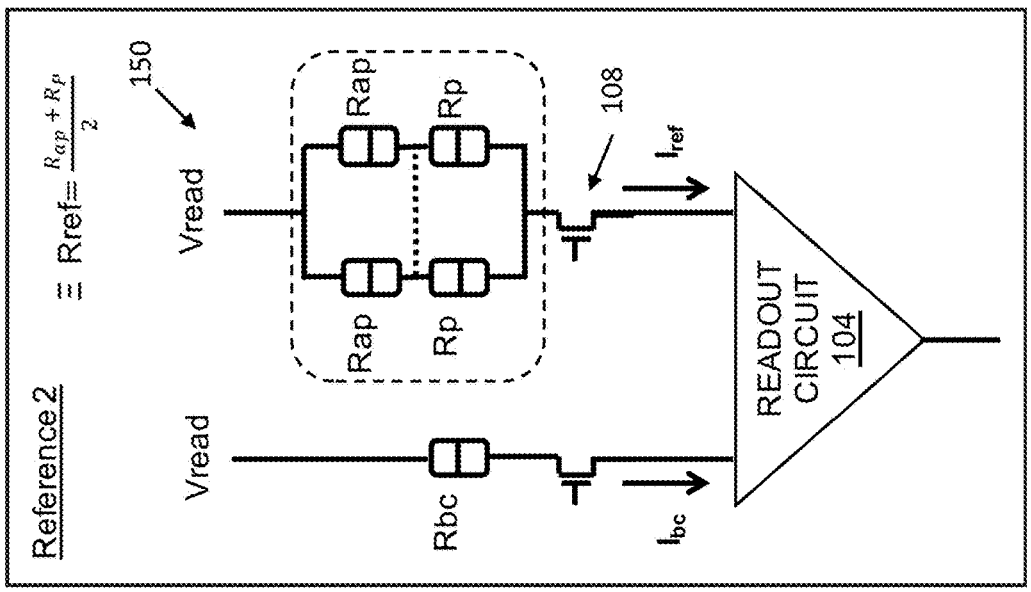
FIG. 1B
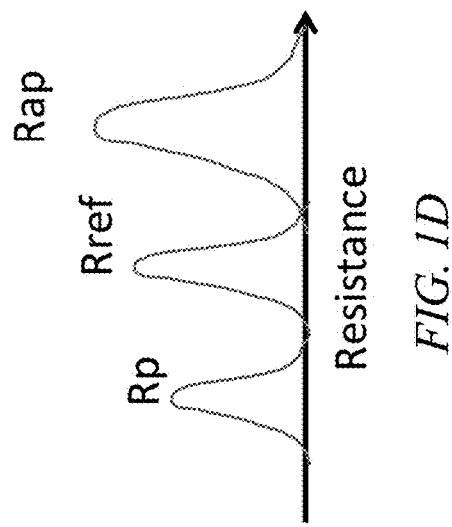
FIG. 1C
FIG. 1D

US 10,741,232 B1

TUNABLE REFERENCE SYSTEM WITH SENSE AMPLIFIER OFFSET CANCELLATION FOR MAGNETIC RANDOM ACCESS MEMORY

BACKGROUND

The present invention relates to the electrical, electronic and computer arts, and more specifically, to magnetic random-access memory (MRAM).

In magnetic random-access memory, the magnetic tunnel junction (MTJ) is the cornerstone of the bit cell array. The MTJ can have two different values of resistance: low resistance, called $R_{parallel}$ (Rp), and high resistance, called $R_{antiparallel}$ (Rap). Each resistance corresponds respectively to a logic state: '1' or '0'. To read the state of the bit cell, two different techniques are conventionally used. The first technique is known as the self-reference readout technique (it does not utilize a reference cell). The self-reference readout technique stores the initial data of the bit cell, adds a small offset of resistance to the reading path, reads the bit cell again, and compares the two values. This first technique may have a better yield than other conventional techniques, but the speed performance can be very low.

The second technique utilizes a reference cell The reference cell can be defined as a resistance value (Rref) which is between Rp and Rap (Rp<Rref<Rap). Ideally, the value of Rref is centered in the middle of Rp and Rap (Rref=(Rp+Rap)/2) to establish a suitable read margin. In practice, Rref is not necessarily centered in the middle of Rp and Rap due to the process variations of Rp and Rap.

FIGS. 1A and 1B are schematic diagrams 100, 150 of conventional read circuits incorporating reference cells. Note that "TMR" refers to tunnel magnetoresistance. A resistance Rbc of a bit cell being read results in a current Ibc that is compared by readout circuit 104 to a reference current Iref. The reference current Iref is determined by the overall resistance Rref of the reference MTJ 108. FIG. 1C shows the ideal case where the reference current Iref is based on the resistance Rref and is centered between I(Rp) and I(Rap). FIG. 1D illustrates an example histogram of MRAM devices where the values of Rp, Rap, and Rref for each MRAM device vary due to process variations. The values of Rp, Rap, and Rref vary on the curve leading to a non-centered value of Rref, a decreased read margin and, consequently, an increased read error rate. Also, the reference cell is based on the Rp and Rap resistances which means that the reference cell requires a bidirectional writing circuit which is often designed to satisfy the MTJ writing conditions.

SUMMARY

Principles of the invention provide a tunable reference system with sense amplifier offset cancellation for magnetic random access memory. In one aspect, an exemplary memory device comprises a memory array of a plurality of memory bit cells; a read reference system comprising four or more reference memory bit cells in a reference column of the memory array, the read reference system configured to generate a read reference signal; wherein a first bit cell of the reference memory bit cells is always selected; wherein a bitline of the first bit cell of the reference memory bit cells is connected to a bitline of a first subset of the reference memory bit cells, and a select line of the first bit cell of the reference memory bit cells is connected to a reference select signal; wherein each of the first subset of the reference memory bit cells is enabled via a corresponding enable line coupled to a gate of the corresponding reference memory bit cell; wherein each of a second subset of the reference memory bit cells is enabled via a corresponding enable line coupled to a gate of the corresponding reference memory bit cell; wherein a select line of each of the first subset of the reference memory bit cells and the second subset of the reference memory bit cells are coupled together; and wherein a bitline $bl_{ref}$ of the second subset of the reference memory bit cells outputs the read reference signal.

In one aspect, a non-transitory computer readable medium comprises computer executable instructions which when executed by a computer cause the computer to perform a method comprising operations of: configuring one or more bit cells of a reference system for reference state 0; writing one or more memory bit cells of a memory array to a logical 0; reading the one or more bit cells of the memory array; determining and storing a count of the one or more bit cells of the memory array that have successfully stored the logical 0; writing the one or more memory bit cells of the memory array to a logical 1; reading the one or more bit cells of the memory array; determining and storing a count of the one or more bit cells of the memory array that have successfully stored the logical 1; determining if all reference states have been tested; configuring the one or more bit cells of the reference system for a next reference state and repeating the writing operations, the reading operations, and the determining and storing operations in response to determining that not all of the reference states have been tested; and comparing the counts for all of the reference states and configuring the reference state of the reference system for the reference state corresponding to a greatest count of correctly read values.

In one aspect, a method for determining an optimal reference state for a reference system comprises operations of: configuring one or more bit cells of a reference system for reference state 0; writing one or more memory bit cells of a memory array to a logical 0; reading the one or more bit cells of the memory array; determining and storing a count of the one or more bit cells of the memory array that have successfully stored the logical 0; writing the one or more memory bit cells of the memory array to a logical 1; reading the one or more bit cells of the memory array; determining and storing a count of the one or more bit cells of the memory array that have successfully stored the logical 1; determining if all reference states have been tested; configuring the one or more bit cells of the reference system for a next reference state and repeating the writing operations, the reading operations, and the determining and storing operations in response to determining that not all of the reference states have been tested; and comparing the counts for all of the reference states and configuring the reference state of the reference system for the reference state corresponding to a greatest count of correctly read values.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments provide one or more of:

a tunable reference system that sets the resistance value of a read reference signal during a test phase to improve the read-error-rate in a memory array;

the reference system is array-layout friendly and represents only a single column of the memory array;

a reference tuning range that is determined by the number of bit cells in one column of the memory array;

the reference system contains only Rp resistance (thus, no write circuit is required); and a reference system where fine-tuning the path resistance compensates for an offset voltage in a readout circuit (typically called a sense amplifier (SA)).

These and other features and advantages of the present invention will become apparent from the following detailed description of illustrative embodiments thereof, which is to be read in connection with the accompanying drawings.

BRIEF DESCRIPTION OF THE DRAWINGS

FIGS. 1A and 1B are schematic diagrams of conventional read circuits incorporating reference cells;

FIG. 1C shows the ideal case where Rref is centered between Rp and Rap;

FIG. 1D illustrates an example histogram of MRAM devices where the values of Rp, Rap, and Rref vary due to process variations;

DETAILED DESCRIPTION

Figure 2:
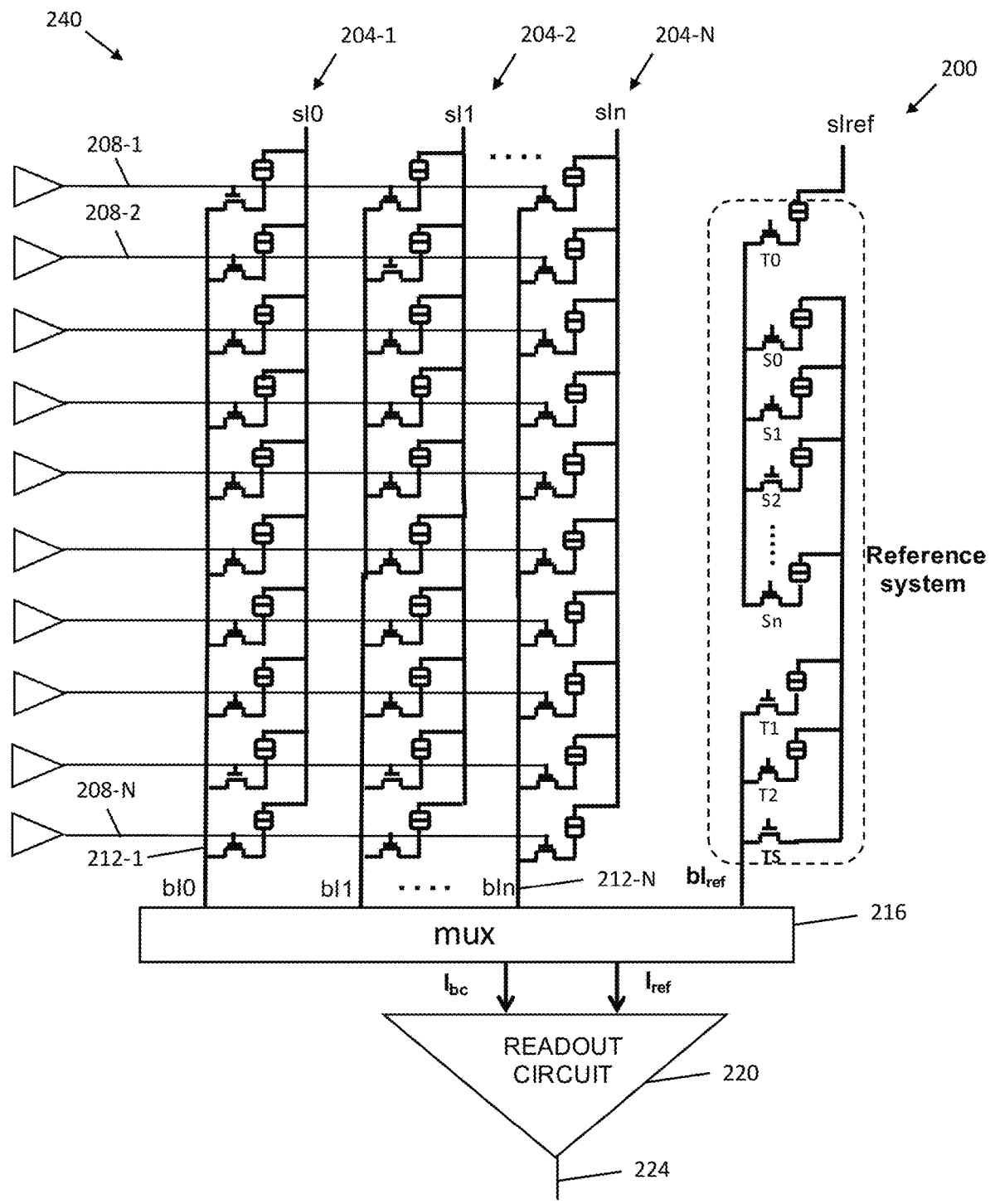
FIG. 2 is a schematic diagram of a memory array integrated with a reference system, in accordance with an example embodiment.

FIG. 2 is a schematic diagram of a memory array 240 integrated with a reference system 200, in accordance with an example embodiment. The tunable/trimmable reference system 200 sets the resistance value of the reference signal $bl_{ref}$ during a test phase to improve the read-error-rate in the memory array 240. In one example embodiment, the reference tuning capability (range) is determined by the number of reference bit cells in the reference column of the memory array 240 dedicated to the tunable/trimmable reference system 200, which ranges between four bit cells and the number of bit cells in a conventional (memory) column of the memory array 240. The remaining columns 204-1, 204-2 . . . 204-N (known collectively as memory columns 204 and columns 204 herein) of the memory array 240 function as conventional data storage columns of the memory array 240. Thus, the tunable/trimmable reference system 200 is array-layout friendly and utilizes only a single column of the memory array 240. The tunable/trimmable reference system 200 contains only Rp resistance. Thus, no write circuit is required. An external magnetic field can be used to set the state of all MTJ's of the memory array 240 to Rp. In one example embodiment, a write circuit is used instead of an external magnet such that the design constraints of the writing driver are relaxed since writing is performed in only one direction (writing the parallel state which is, technologically, easier than writing the antiparallel state).

The readout circuit 220 (also known as a sense amplifier (SA) herein) has, in general, a certain offset voltage. This offset voltage can also be compensated for with the reference system 200 by fine-tuning the path resistance. Wordlines 208-1, 208-2 . . . 208-N (known collectively as wordlines 208 herein) are used to select a bit cell within each column 204. The output from each column 204 is read by the readout circuit 220 via bitlines 212-1 . . . 212-N (known collectively as bitlines 212 herein) and multiplexer 216. The readout circuit 220 compares the output of the multiplexer 216 and the reference signal $bl_{ref}$ generated by the reference system 200 to generate the output data signal 224.

With reference to the reference system 200 of FIG. 2, transistors T0, T1, T2, and TS constitute a basic reference system 200. The number of additional transistors incorporated into the reference system 200, such as transistors S0, S1, S2 . . . Sn, is a design choice based on the desired number of trimming steps and the corresponding reference resistances Rref. The function of transistor TS is to enable trimming between Rp and Rp/2 when transistor TS is on and between (⅔)Rp and Rap when transistor TS is off.

Figure 3:
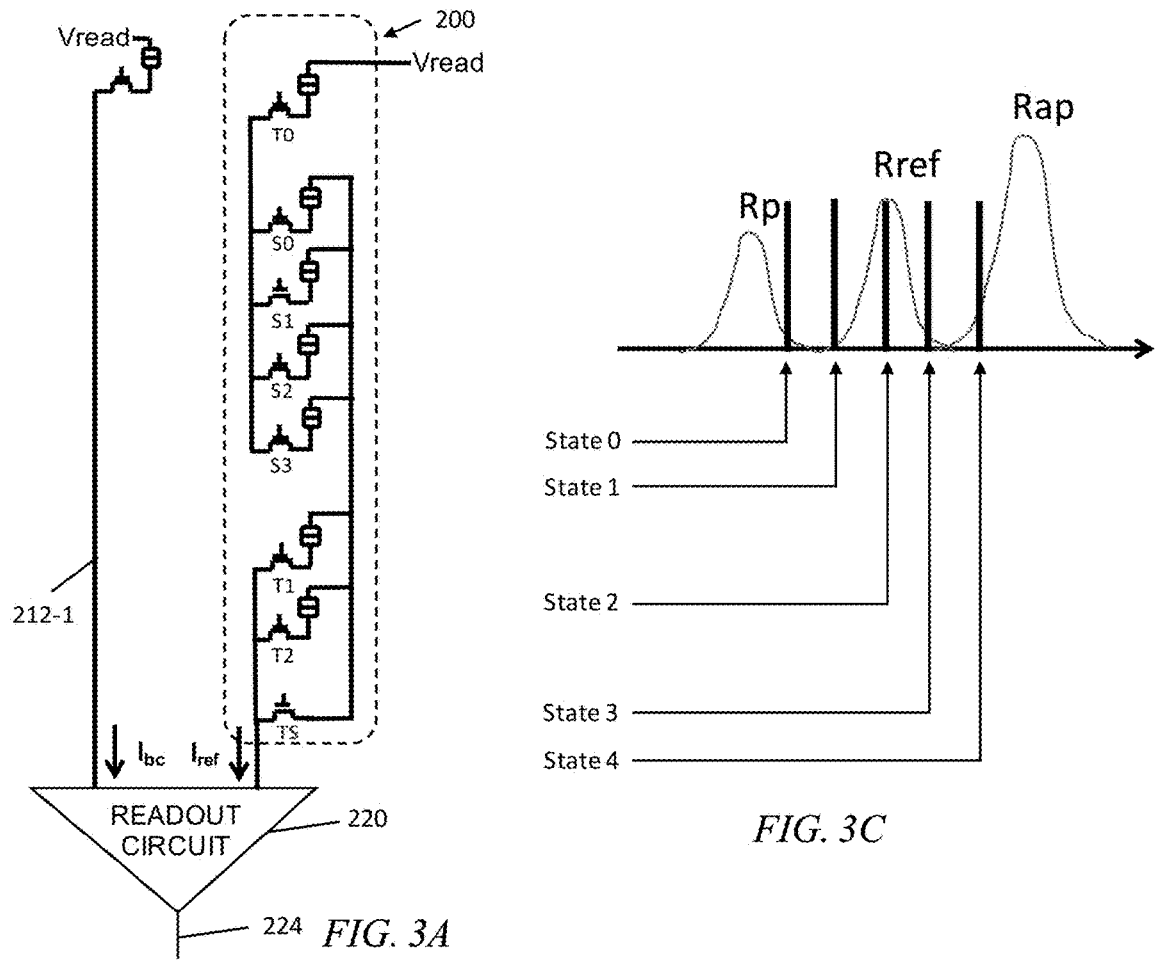
FIG. 3A a schematic diagram of a portion of the memory array integrated with the reference system, in accordance with an example embodiment.
FIG. 3B is a table of example states for the reference system of FIG. 3A, in accordance with an example embodiment.
FIG. 3C illustrates the reference resistances Rref that are generated for each of states 0 through 4 of the reference system 200, in accordance with an example embodiment.

FIG. 3A a schematic diagram of a portion of the memory array 240 integrated with the reference system 200, in accordance with an example embodiment. The reference system 200 includes one reference column of bit cells in the memory array 240 which are connected such that Rref=Rp+ k*Rp. MJT T0 is always selected and configures Rp in series with a trimming system comprising MJTs T1, T2, TS, S0, S1, S2, and S3. The trimming system can contain many bit cells (MTJs) or it can contain only a few bit cells (MTJs) depending on the tuning capability that is to be achieved. In the reference system 200 of FIG. 3A, only eight bit cells are used, providing five different values for the reference resistance. When running the test phase, different combinations of bit cells in the reference system 200 can be tested and the one which offers the lowest read-error-rate can be selected. The selected combination intrinsically takes into account the process variations of the memory device and the offset of the readout circuit 220. Since the reference system 200 is based on only the Rp resistance, an external magnetic field may be applied to set all states of the MTJs to the Rp state. Otherwise, the MTJs can be written by adding a writing driver. The design restrictions will be alleviated because only one direction (Rp) is written which is, by default, the easy state to write in MRAMs.

FIG. 3B is a table of example states for the reference system 200 of FIG. 3A, in accordance with an example embodiment. As illustrated in FIG. 3B, reference state 0 generates a reference resistance of Ref=Rp+(¼)Rp, reference state 1 generates a reference resistance of Ref=Rp+(⅓)Rp, and reference state 5 generates a reference resistance of Ref=(3/2)Rp+(⅓)Rp. FIG. 3C illustrates the reference resistances Rref that are generated for each of states 0 through 4 of the reference system 200, in accordance with an example embodiment.

Figure 4:
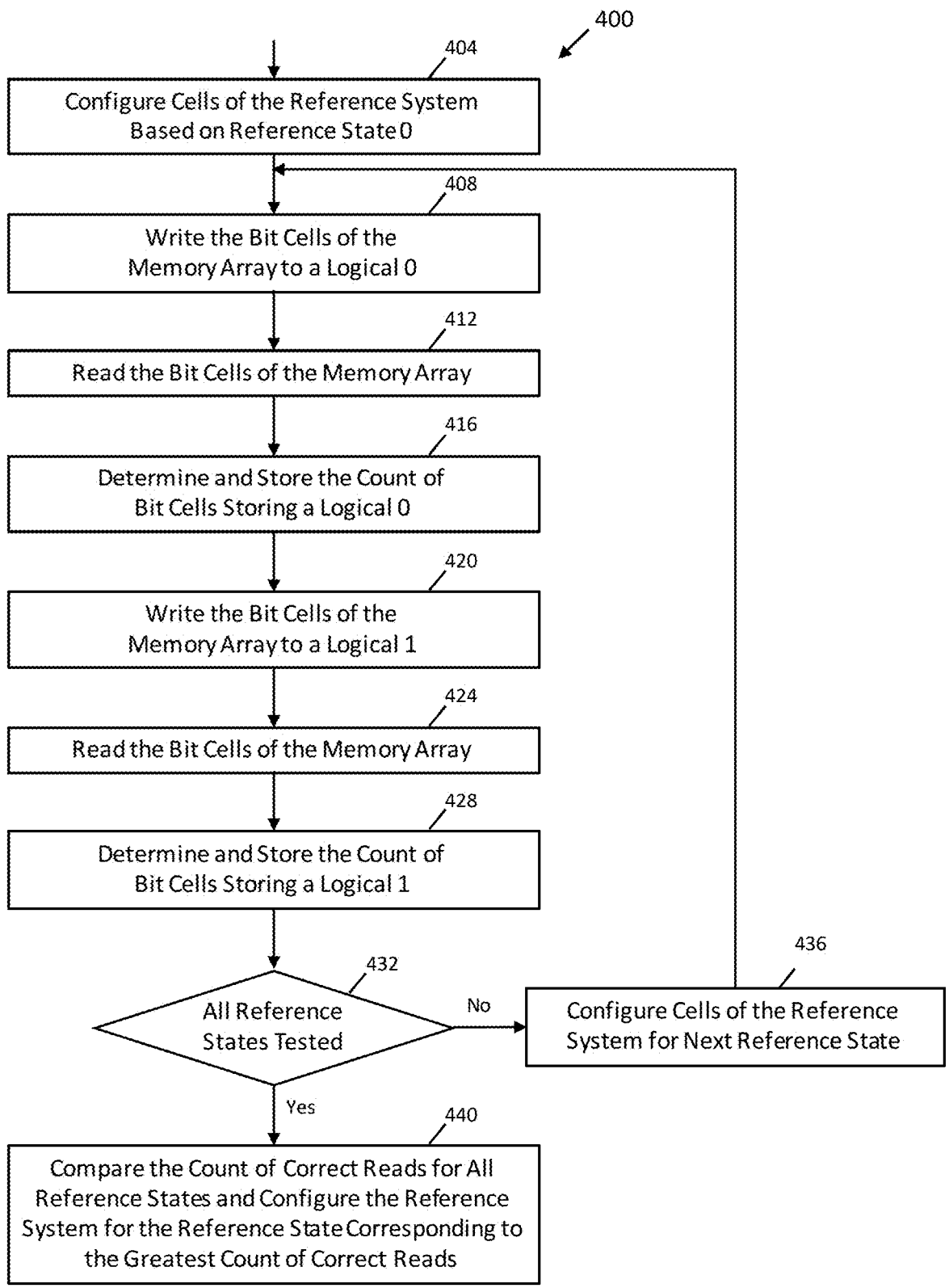
FIG. 4 is a flowchart for an example method for determining the combination of bit cells and corresponding states to configure the reference system, in accordance with an example embodiment.

FIG. 4 is a flowchart for an example method 400 for determining the optimal reference state for the reference system 200, in accordance with an example embodiment. In one example embodiment, the reference bit cells of the reference system 200 are configured for reference state 0 (operation 404). The memory bit cells of the columns 204 of the memory array 240 are written with a logical zero (operation 408), the bit cells of the columns 204 of the memory array 240 are read (operation 412), and a count of the bit cells of the columns 204 of the memory array 240 that have successfully stored the logical zero is determined and stored (operation 416). The bit cells of the columns 204 of the memory array 240 are written with a logical one (operation 420), the bit cells of the columns 204 of the memory array 240 are read (operation 424), and a count of the bit cells of the columns 204 of the memory array 240 that have successfully stored a logical one is determined and stored (operation 428).

A check is performed to determine if all the reference states have been tested (operation 432). If all the reference states have not been tested (NO branch of operation 432), the bit cells of the reference system 200 are configured for the next reference state (operation 436) and the method proceeds with operation 408; otherwise, the counts of correctly read values for all of the reference states are compared and the reference system 200 is configured for the reference state that corresponds to the greatest count of correct reads (operation 440). The method 400 then ends.

Given the discussion thus far, it will be appreciated that, in general terms, an exemplary method, according to an aspect of the invention, includes the operations of configuring one or more bit cells of a reference system 200 for reference state 0 (operation 404); writing one or more memory bit cells of a memory array 240 to a logical 0 (operation 408); reading the one or more bit cells of the memory array 240 (operation 412); determining and storing a count of the one or more bit cells of the memory array 240 that have successfully stored the logical 0 (operation 416)); writing the one or more memory bit cells of the memory array 240 to a logical 1 (operation 420); reading the one or more bit cells of the memory array 240 (operation 424); determining and storing a count of the one or more bit cells of the memory array 240 that have successfully stored the logical 1 (operation 428); determining if all reference states have been tested (operation 432); configuring the one or more bit cells of the reference system 200 for a next reference state (operation 436) and repeating the writing operations, the reading operations, and the determining and storing operations in response to determining that not all of the reference states have been tested; and comparing the counts for all of the reference states and configuring the reference state of the reference system 200 for the reference state corresponding to a greatest count of correctly read values (operation 440).

In one aspect, a memory device comprises a memory array 240 of a plurality of memory bit cells; a read reference system 200 comprising four or more reference memory bit cells in a reference column of the memory array 240, the read reference system 200 configured to generate a read reference signal; wherein a first bit cell of the reference memory bit cells is always selected; wherein a bitline 212 of the first bit cell of the reference memory bit cells is connected to a bitline 212 of a first subset of the reference memory bit cells, and a select line of the first bit cell of the reference memory bit cells is connected to a reference select signal; wherein each of the first subset of the reference memory bit cells is enabled via a corresponding enable line coupled to a gate of the corresponding reference memory bit cell; wherein each of a second subset of the reference memory bit cells is enabled via a corresponding enable line coupled to a gate of the corresponding reference memory bit cell; wherein a select line of each of the first subset of the reference memory bit cells and the second subset of the reference memory bit cells are coupled together; and wherein a bitline $bl_{ref}$ 212 of the second subset of the reference memory bit cells outputs the read reference signal.

In one example embodiment, the four or more reference memory bit cells are connected such that the read reference signal is defined by Rp+k*Rp. In one example embodiment, a selected combination of the reference memory bit cells intrinsically compensates for process variations of the memory device and an offset of a readout circuit 220. In one example embodiment, an external magnetic field is applied to set a state of all magnetic tunnel junctions of the reference memory bit cells to an Rp state. In one example embodiment, a magnetic tunnel junction of the memory array 240 is written via a writing driver. In one example embodiment, the readout circuit 220 is configured to compare a read signal from one of the memory bit cells and the read reference signal. In one example embodiment, a reference state 0 generates a reference resistance of Rp+(¼)Rp, a reference state 1 generates a reference resistance of Rp+(⅓)Rp, and a reference state 5 generates a reference resistance of (3/2)Rp+(⅓)Rp, where Rp is a low resistance $R_{parallel}$ of an MTJ of the memory device.

In one example embodiment, a processor is configured for testing the plurality of memory bit cells and for configuring a reference state of the read reference system 200. In one example embodiment, the processor is configured to perform operations comprising configuring the read reference system 200 for reference state 0 (operation 404); determining and storing a count of the one or more bit cells of the memory array 240 that have successfully stored one or more given data values (operations 416 and 428); determining if all reference states have been tested (operation 432); configuring the one or more bit cells of the reference system 200 for a next reference state (operation 436) and repeating the determining and storing operations in response to determining that not all of the reference states have been tested; and comparing the counts for all of the reference states and configuring the reference state of the reference system 200 for the reference state corresponding to a greatest count of correctly read values (operation 440).

In one example embodiment, the processor is further configured to perform operations comprising writing one or more memory bit cells of the memory array 240 to a logical 0 (operation 408); reading the one or more bit cells of the memory array 240 (operation 412); determining and storing a count of the one or more bit cells of the memory array 240 that have successfully stored the logical 0 (operation 416); writing the one or more memory bit cells of the memory array 240 to a logical 1 (operation 420); reading the one or more bit cells of the memory array 240 (operation 424); and determining and storing a count of the one or more bit cells of the memory array 240 that have successfully stored the logical 1 (operation 428).

In one aspect, a non-transitory computer readable medium comprises computer executable instructions which when executed by a computer cause the computer to perform a method comprising operations of: configuring one or more bit cells of a reference system 200 for reference state 0 (operation 404); writing one or more memory bit cells of a memory array 240 to a logical 0 (operation 408); reading the one or more bit cells of the memory array 240 (operation 412); determining and storing a count of the one or more bit cells of the memory array 240 that have successfully stored the logical 0 (operation 416); writing the one or more memory bit cells of the memory array 240 to a logical 1 (operation 420); reading the one or more bit cells of the memory array 240 (operation 424); determining and storing a count of the one or more bit cells of the memory array 240 that have successfully stored the logical 1 (operation 428); determining if all reference states have been tested (operation 432); configuring the one or more bit cells of the reference system 200 for a next reference state (operation 436) and repeating the writing operations, the reading operations, and the determining and storing operations in response to determining that not all of the reference states have been tested; and comparing the counts for all of the reference states and configuring the reference state of the reference system 200 for the reference state corresponding to a greatest count of correctly read values (operation 440).

In one or more embodiments, a further step includes fabricating a physical integrated circuit in accordance with the analyzed design. One non-limiting specific example of accomplishing this is described elsewhere herein in connection with FIGS. 5-7. For example, a design structure, based on the analyzed design, is provided to fabrication equipment to facilitate fabrication of a physical integrated circuit in accordance with the design structure.

In one or more embodiments, a layout is prepared based on the analysis.

In one or more embodiments, the layout is instantiated as a design structure.

In one or more embodiments, a physical integrated circuit is fabricated in accordance with the design structure.

As noted, in one or more embodiments, the layout is instantiated as a design structure. See discussion of FIG. 5. A physical integrated circuit is then fabricated in accordance with the design structure. See again discussion of FIG. 5. Refer also to FIG. 6. Once the physical design data is obtained, based, in part, on the analytical processes described herein, an integrated circuit designed in accordance therewith can be fabricated according to known processes that are generally described with reference to FIG. 6. Generally, a wafer with multiple copies of the final design is fabricated and cut (i.e., diced) such that each die is one copy of the integrated circuit. At block 810, the processes include fabricating masks for lithography based on the finalized physical layout. At block 820, fabricating the wafer includes using the masks to perform photolithography and etching. Once the wafer is diced, testing and sorting each die is performed at 830 to filter out any faulty die.

Figure 8:
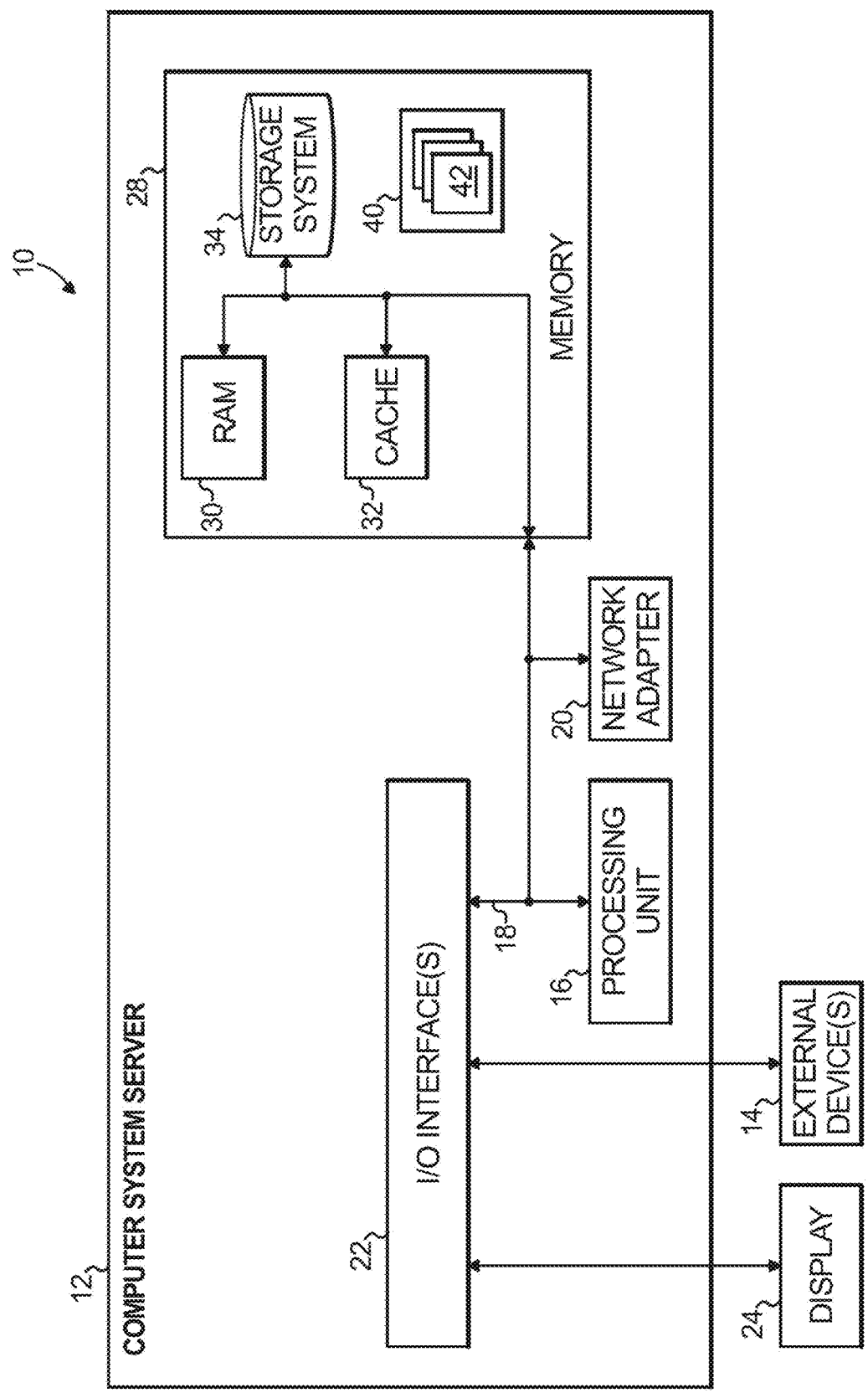
FIG. 8 depicts a computer system that may be useful in implementing one or more aspects and/or elements of the invention.

One or more embodiments include a computer including a memory 28; and at least one processor 16, coupled to the memory, and operative to carry out or otherwise facilitate any one, some, or all of the method steps described herein (as depicted in FIG. 8).

Figure 5:
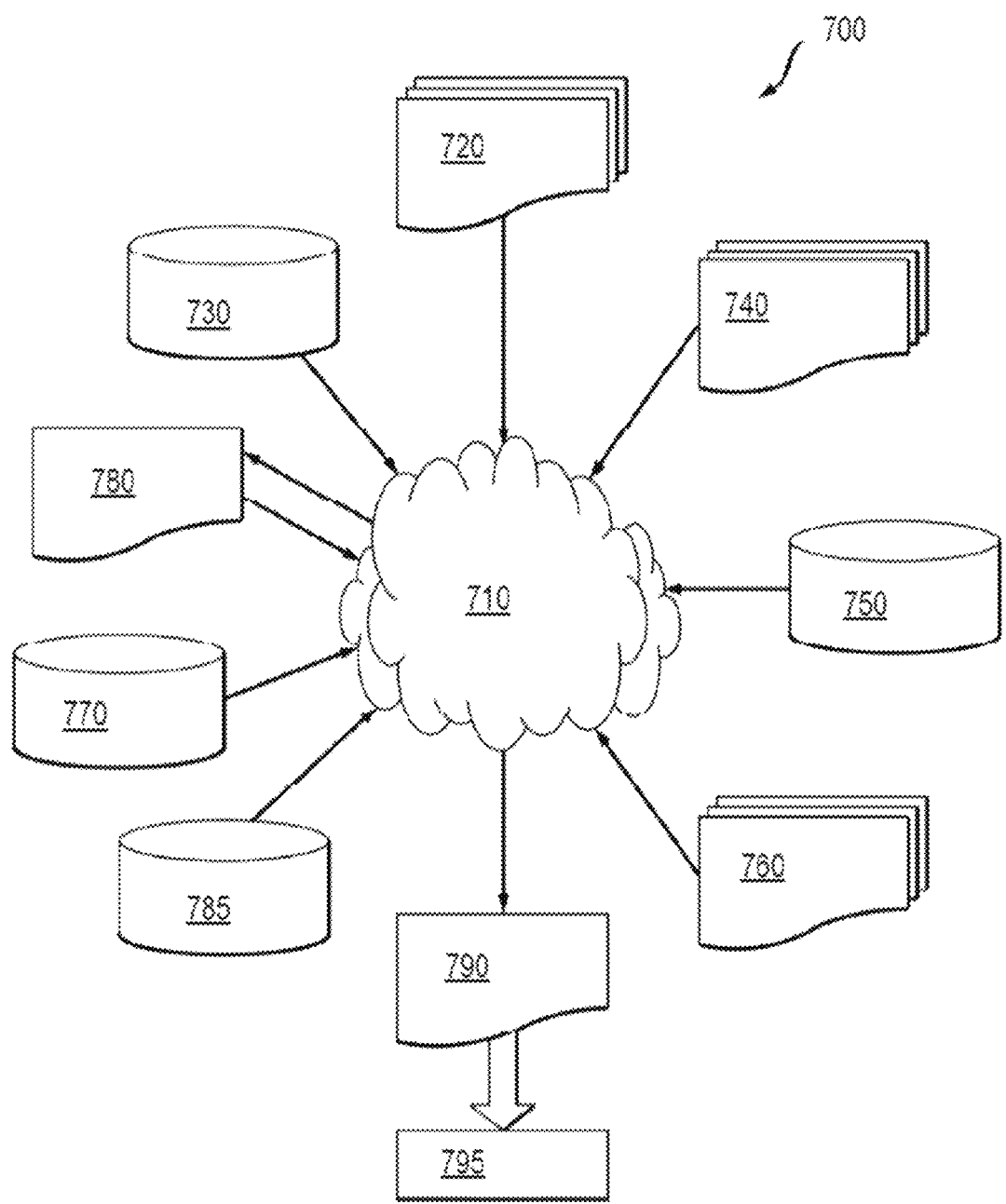
FIG. 5 is a flow diagram of a design process used in semiconductor design, manufacture, and/or test.
Figure 6:
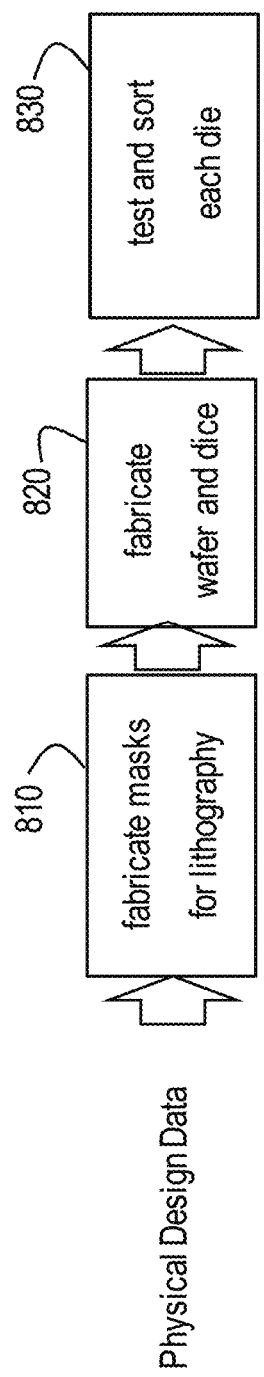
FIG. 6 shows further aspects of IC fabrication from physical design data.

Furthermore, referring to FIG. 5, in one or more embodiments the at least one processor is operative to generate a design structure for the integrated circuit design in accordance with the analysis, and in at least some embodiments, the at least one processor is further operative to control integrated circuit manufacturing equipment to fabricate a physical integrated circuit in accordance with the design structure. Thus, the layout can be instantiated as a design structure, and the design structure can be provided to fabrication equipment to facilitate fabrication of a physical integrated circuit in accordance with the design structure. The physical integrated circuit will be improved (for example, because the memory reference system is array-layout friendly and represents only a single column of the memory array; and because the fine-tuning of the path resistance compensates for an offset voltage in the readout circuit) compared to circuits designed using prior art techniques.

Figure 7:
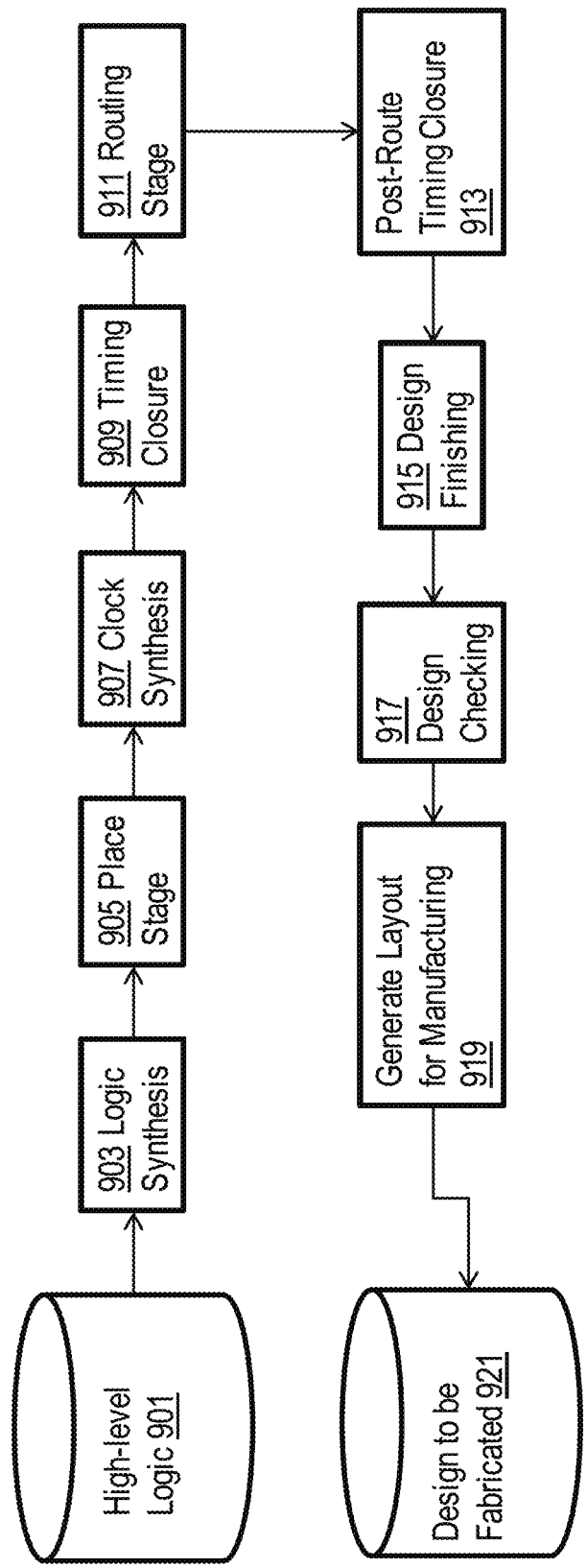
FIG. 7 shows an exemplary high-level Electronic Design Automation (EDA) tool flow, within which aspects of the invention can be employed.

FIG. 7 depicts an example high-level Electronic Design Automation (EDA) tool flow, which is responsible for creating an optimized microprocessor (or other IC) design to be manufactured. A designer could start with a high-level logic description 901 of the circuit (e.g. VHDL or Verilog). The logic synthesis tool 903 compiles the logic, and optimizes it without any sense of its physical representation, and with estimated timing information. The placement tool 905 takes the logical description and places each component, looking to minimize congestion in each area of the design. The clock synthesis tool 907 optimizes the clock tree network by cloning/balancing/buffering the latches or registers. The timing closure step 909 performs a number of optimizations on the design, including buffering, wire tuning, and circuit repowering; its goal is to produce a design which is routable, without timing violations, and without excess power consumption. The routing stage 911 takes the placed/optimized design, and determines how to create wires to connect all of the components, without causing manufacturing violations. Post-route timing closure 913 performs another set of optimizations to resolve any violations that are remaining after the routing. Design finishing 915 then adds extra metal shapes to the netlist, to conform with manufacturing requirements. The checking steps 917 analyze whether the design is violating any requirements such as manufacturing, timing, power, or noise. When the design is clean, the final step 919 is to generate a layout for the design, representing all the shapes to be fabricated in the design to be fabricated 921.

One or more embodiments of the invention, or elements thereof, can be implemented in the form of an apparatus including a memory and at least one processor that is coupled to the memory and operative to perform exemplary method steps. FIG. 8 depicts a computer system that may be useful in implementing one or more aspects and/or elements of the invention; it is referred to herein as a cloud computing node but is also representative of a server, general purpose-computer, etc. which may be provided in a cloud or locally.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 8, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 8, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 8) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

One example of user interface that could be employed in some cases is hypertext markup language (HTML) code served out by a server or the like, to a browser of a computing device of a user. The HTML is parsed by the browser on the user's computing device to create a graphical user interface (GUI).

Exemplary System and Article of Manufacture Details

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Exemplary Design Process Used in Semiconductor Design, Manufacture, and/or Test

One or more embodiments integrate the characterizing and simulating techniques herein with semiconductor integrated circuit design simulation, test, layout, and/or manufacture. In this regard, FIG. 5 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc. Improved characterization and simulation of library gates to enable identification and elimination of electromigration violations can be performed as described herein.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device comprising:
   a memory array of a plurality of memory bit cells;
   a read reference system comprising four or more reference memory bit cells in a reference column of the memory array, the read reference system configured to generate a read reference signal;
   wherein a first bit cell of the reference memory bit cells is always selected;
   wherein a bitline of the first bit cell of the reference memory bit cells is connected to a bitline of a first subset of the reference memory bit cells, and a select line of the first bit cell of the reference memory bit cells is connected to a reference select signal;
   wherein each of the first subset of the reference memory bit cells is enabled via a corresponding enable line coupled to a gate of the corresponding reference memory bit cell;
   wherein each of a second subset of the reference memory bit cells is enabled via a corresponding enable line coupled to a gate of the corresponding reference memory bit cell;
   wherein a select line of each of the first subset of the reference memory bit cells and the second subset of the reference memory bit cells are coupled together; and
   wherein a bitline $bl_{ref}$ of the second subset of the reference memory bit cells outputs the read reference signal.

2. The memory device of claim 1, wherein the four or more reference memory bit cells are connected such that the read reference signal is defined by Rp+k*Rp.

3. The memory device of claim 1, wherein a selected combination of the reference memory bit cells intrinsically compensates for process variations of the memory device and an offset of a readout circuit.

4. The memory device of claim 1, wherein an external magnetic field is applied to set a state of all magnetic tunnel junctions of the reference memory bit cells to an Rp state.

5. The memory device of claim 1, wherein a magnetic tunnel junction of the memory array is written via a writing driver.

6. The memory device of claim 1, further comprising a readout circuit, the readout circuit configured to compare a read signal from one of the memory bit cells and the read reference signal.

7. The memory device of claim 1, wherein a reference state 0 generates a reference resistance of Rp+(¼)Rp, a reference state 1 generates a reference resistance of Rp+(⅓) Rp, and a reference state 5 generates a reference resistance of (3/2)Rp+(⅓)Rp, where Rp is a low resistance $R_{parallel}$ of an MTJ of the memory device.

8. The memory device of claim 1, further comprising a processor for testing the plurality of memory bit cells and for configuring a reference state of the read reference system.

9. The memory device of claim 8, wherein the processor is configured to perform operations comprising:
   configuring the read reference system for reference state 0;
   determining and storing a count of the one or more bit cells of the memory array that have successfully stored one or more given data values;

determining if all reference states have been tested;

configuring the one or more bit cells of the reference system for a next reference state and repeating the determining and storing operations in response to determining that not all of the reference states have been tested; and comparing the counts for all of the reference states and configuring the reference state of the reference system for the reference state corresponding to a greatest count of correctly read values.

10. The memory device of claim 8, wherein the processor is further configured to perform operations comprising:

writing one or more memory bit cells of the memory array to a logical 0;

reading the one or more bit cells of the memory array;

determining and storing a count of the one or more bit cells of the memory array that have successfully stored the logical 0;

writing the one or more memory bit cells of the memory array to a logical 1;

reading the one or more bit cells of the memory array; and determining and storing a count of the one or more bit cells of the memory array that have successfully stored the logical 1.

11. A non-transitory computer readable medium comprising computer executable instructions which when executed by a computer cause the computer to perform a method comprising operations of:

configuring one or more bit cells of a reference system for reference state 0;

writing one or more memory bit cells of a memory array to a logical 0;

reading the one or more bit cells of the memory array;

determining and storing a count of the one or more bit cells of the memory array that have successfully stored the logical 0;

writing the one or more memory bit cells of the memory array to a logical 1;

reading the one or more bit cells of the memory array;

determining and storing a count of the one or more bit cells of the memory array that have successfully stored the logical 1;

determining if all reference states have been tested;

configuring the one or more bit cells of the reference system for a next reference state and repeating the writing operations, the reading operations, and the determining and storing operations in response to determining that not all of the reference states have been tested; and comparing the counts for all of the reference states and configuring the reference state of the reference system for the reference state corresponding to a greatest count of correctly read values.

12. A method for determining an optimal reference state for a reference system, the method comprising operations of:

configuring one or more bit cells of a reference system for reference state 0;

writing one or more memory bit cells of a memory array to a logical 0;

reading the one or more bit cells of the memory array;

determining and storing a count of the one or more bit cells of the memory array that have successfully stored the logical 0;

writing the one or more memory bit cells of the memory array to a logical 1;

reading the one or more bit cells of the memory array;

determining and storing a count of the one or more bit cells of the memory array that have successfully stored the logical 1;

determining if all reference states have been tested;

configuring the one or more bit cells of the reference system for a next reference state and repeating the writing operations, the reading operations, and the determining and storing operations in response to determining that not all of the reference states have been tested; and comparing the counts for all of the reference states and configuring the reference state of the reference system for the reference state corresponding to a greatest count of correctly read values.

* * * * *